(12) United States Patent
Yoshinaga et al.

(10) Patent No.: US 6,335,547 B1
(45) Date of Patent: Jan. 1, 2002

(54) EPITAXIAL WAFER FOR INFRARED LIGHT-EMITTING DEVICE AND LIGHT-EMITTING DEVICE USING THE SAME

(75) Inventors: Atsushi Yoshinaga; Toshiyuki Tanaka, both of Saitama (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/559,977

(22) Filed: Apr. 27, 2000

Related U.S. Application Data

(60) Provisional application No. 60/159,650, filed on Oct. 18, 1999.

(30) Foreign Application Priority Data

Apr. 27, 1999 (JP) .............................................. 11-119653
Sep. 24, 1999 (JP) .............................................. 11-270348

(51) Int. Cl.[7] .............................................. H01L 33/00
(52) U.S. Cl. .......................... 257/94; 257/96; 257/97; 257/101; 257/102
(58) Field of Search .............................. 257/94, 96, 97, 257/101, 102

(56) References Cited

U.S. PATENT DOCUMENTS

| | | | | |
|---|---|---|---|---|
| 4,680,602 A | * | 7/1987 | Watanabe et al. | ............. 357/17 |
| 4,864,369 A | * | 9/1989 | Snyder eet al. | ............... 357/17 |
| 5,185,288 A | * | 2/1993 | Cook et al. | .................. 437/122 |
| 5,665,984 A | * | 9/1997 | Hasegawa et al. | ............. 257/94 |
| 5,808,324 A | * | 9/1998 | Yamada et al. | ............... 257/96 |

FOREIGN PATENT DOCUMENTS

JP          56094789 A  *  7/1981

* cited by examiner

*Primary Examiner*—Nathan Flynn
*Assistant Examiner*—Remmon R. Fordé
(74) *Attorney, Agent, or Firm*—Sughrue, Mion, Zinn, Macpeak & Seas, PLLC

(57) ABSTRACT

The invention provides an epitaxial wafer including a first p-type layer; a p-type cladding layer; a p-type active layer; an n-type cladding layer; and a second n-type layer stacked on a p-type GaAs single-crystal substrate, wherein Zn is employed as a dopant in the first p-type layer; Ge is employed as a dopant in the p-type cladding layer and the p-type active layer; Te is employed as a dopant in the n-type cladding later and the second n-type layer; the average carrier concentration of the n-type cladding layer and the second n-type layer is $8 \times 10^{17}$ cm$^{-3}$ to $2 \times 10^{18}$ cm$^{-3}$; the n-type cladding layer has a thickness of 60–80 $\mu$m; the second n-type layer has a total concentration of Zn and Ge of $1 \times 10^{17}$ atoms/cm$^3$ or less; the dopant concentration of the portion in the second n-type layer within 3 $\mu$m of the interface between the n-type cladding layer and the second n-type layer is $3 \times 10^{17}$ cm$^{-3}$ or more; the Al compositional proportion in the n-type cladding layer or the second n-type layer is 0.10–0.35; the p-type active layer has a thickness of 0.5–1.2 $\mu$m; and the p-type active layer has an oxygen concentration of less than $3 \times 10^{16}$ atoms/cm$^3$. Epitaxial wafers for fabricating high-intensity and long-service-life GaAlAs infrared light-emitting devices are provided.

7 Claims, 8 Drawing Sheets

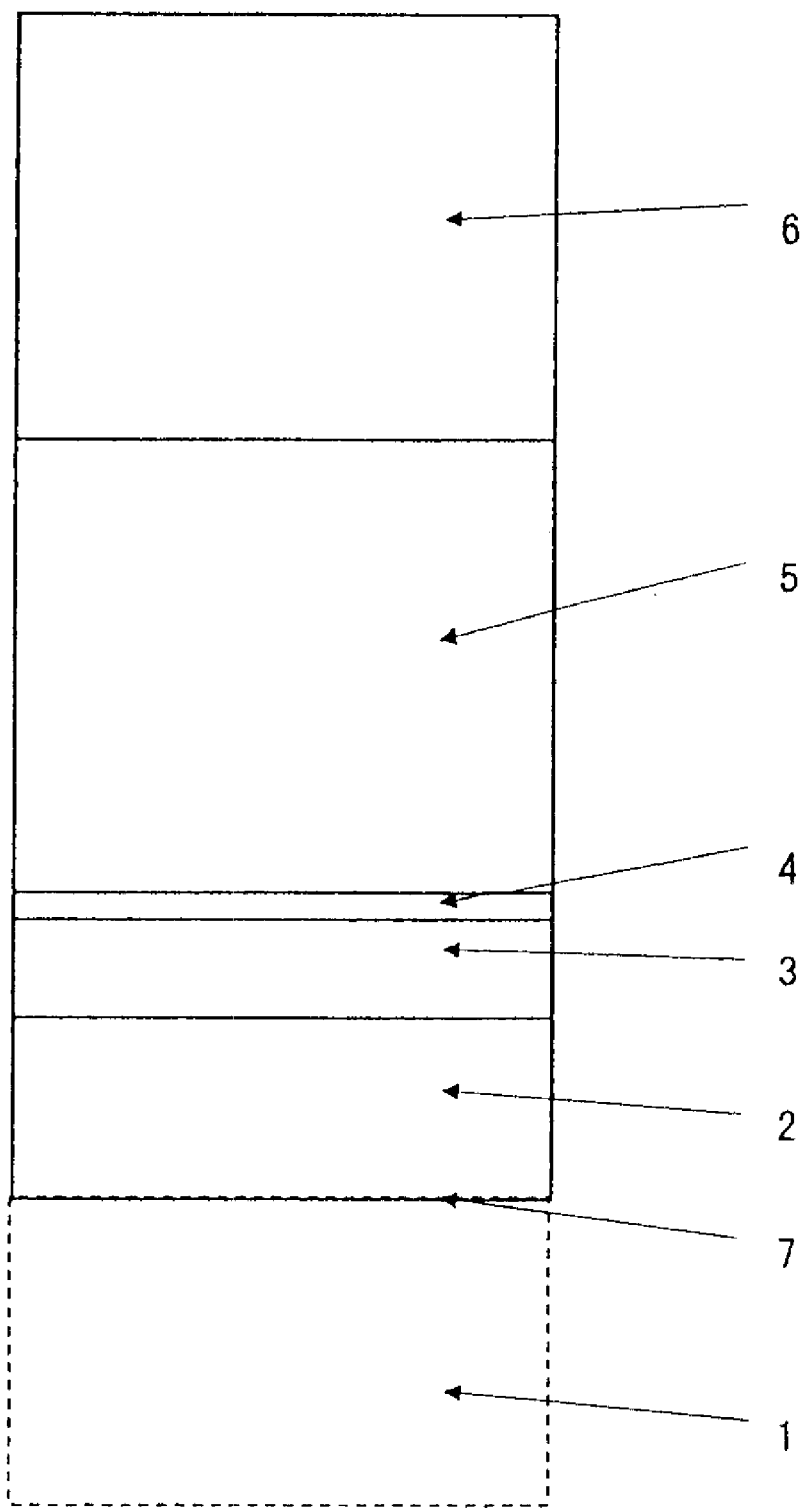
[Fig. 1]

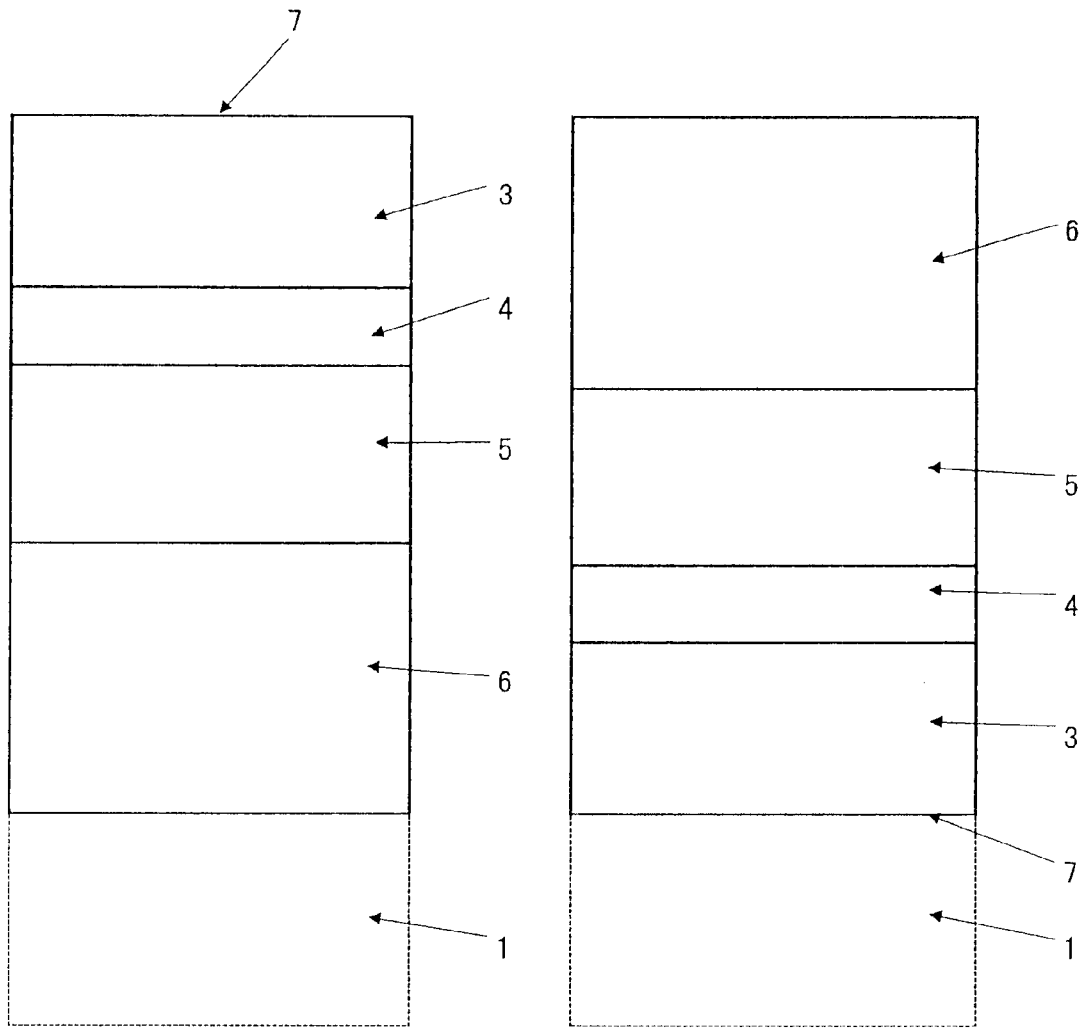
[Fig. 2] [Fig. 3]

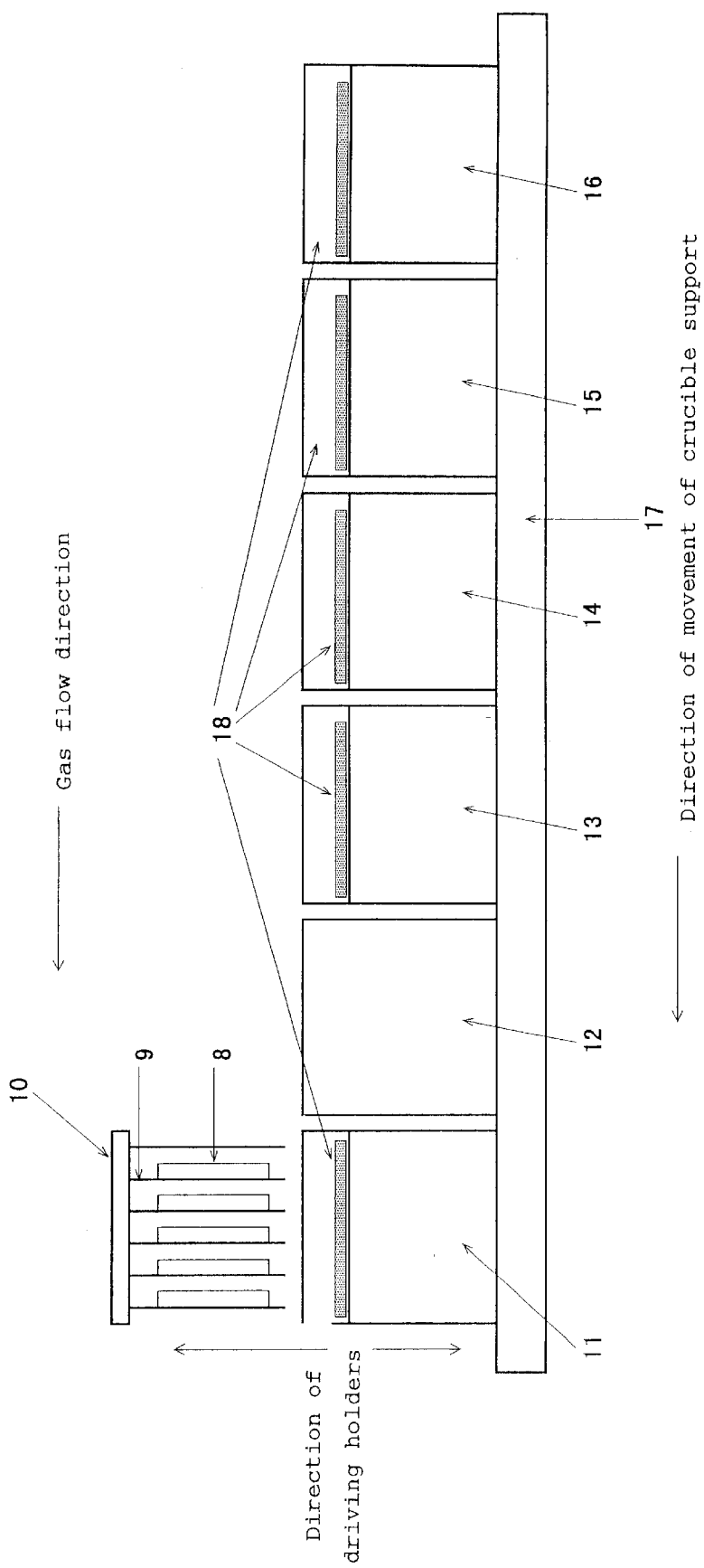
[Fig. 4]

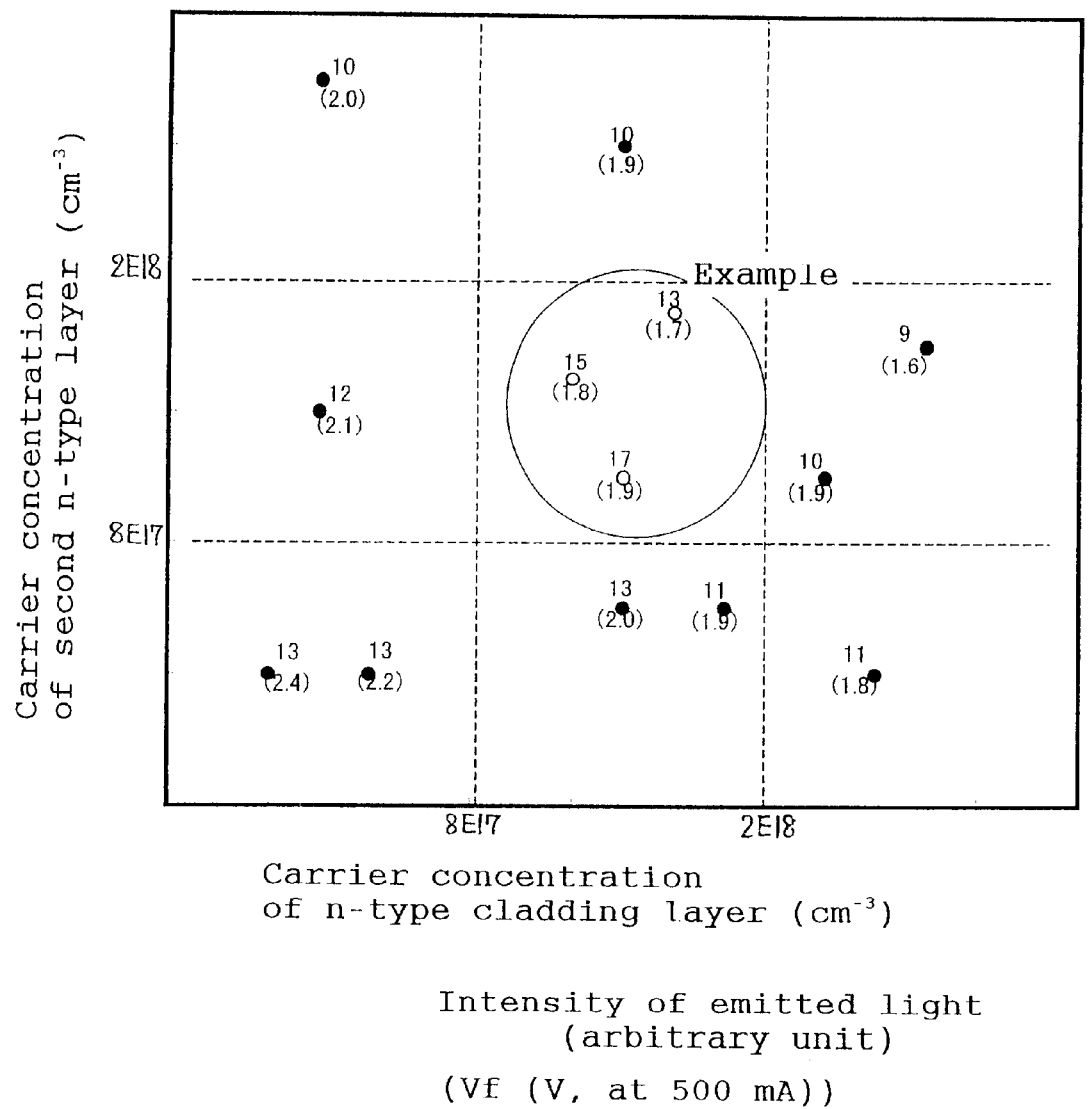
[Fig. 5]

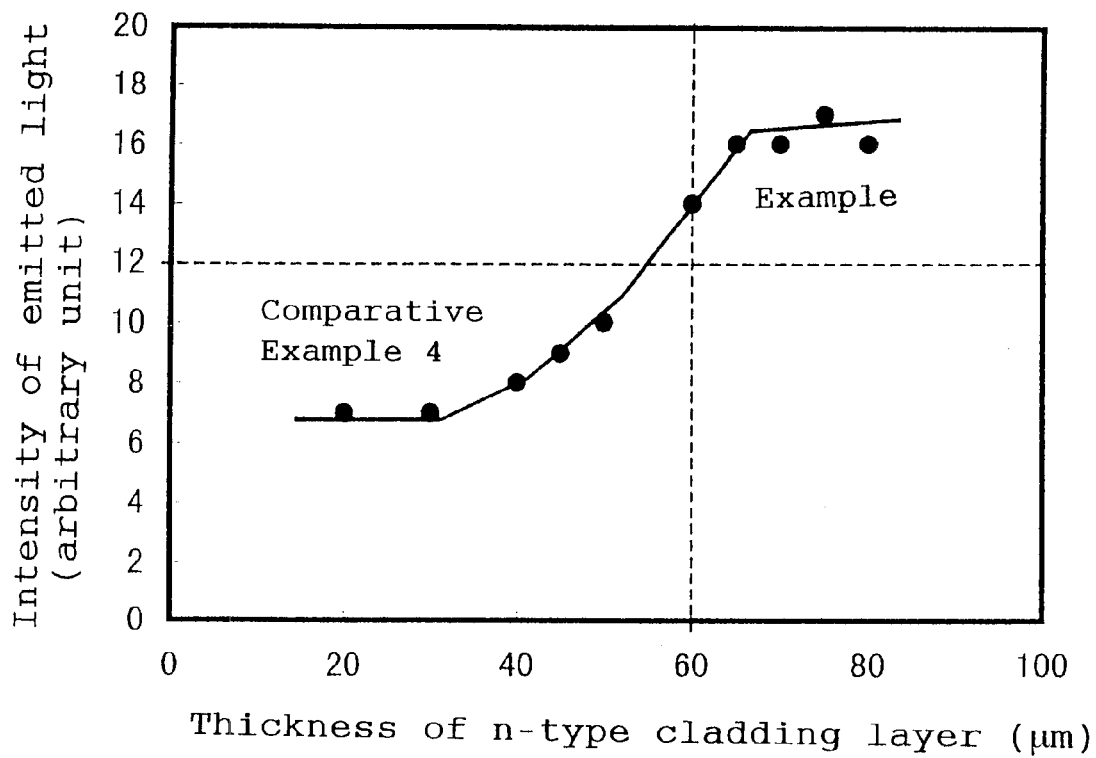
[Fig. 6]

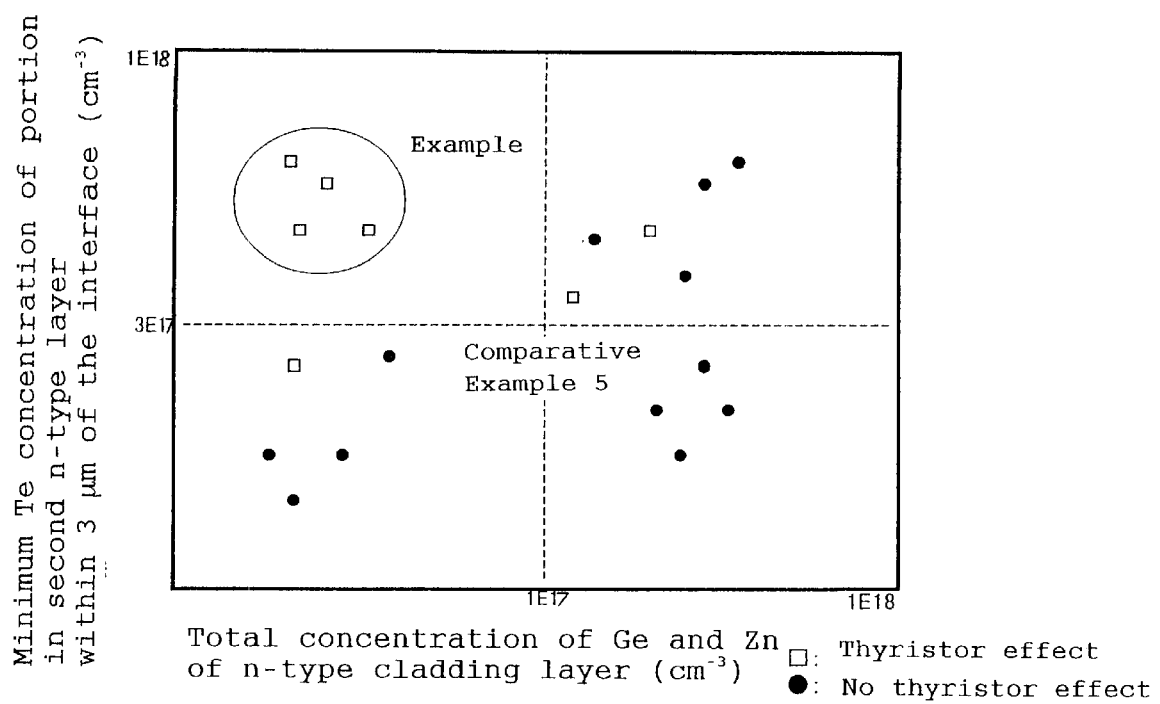
[Fig. 7]

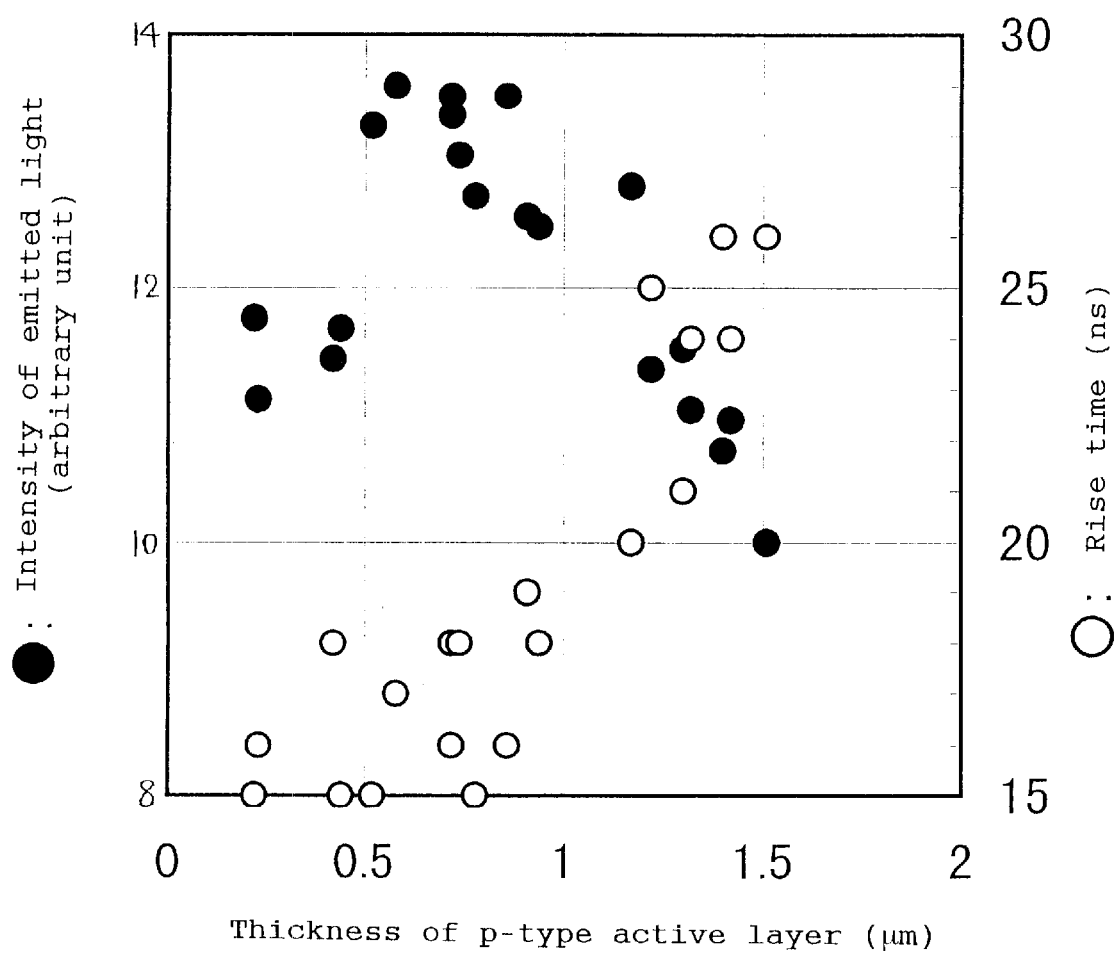
[Fig. 8]

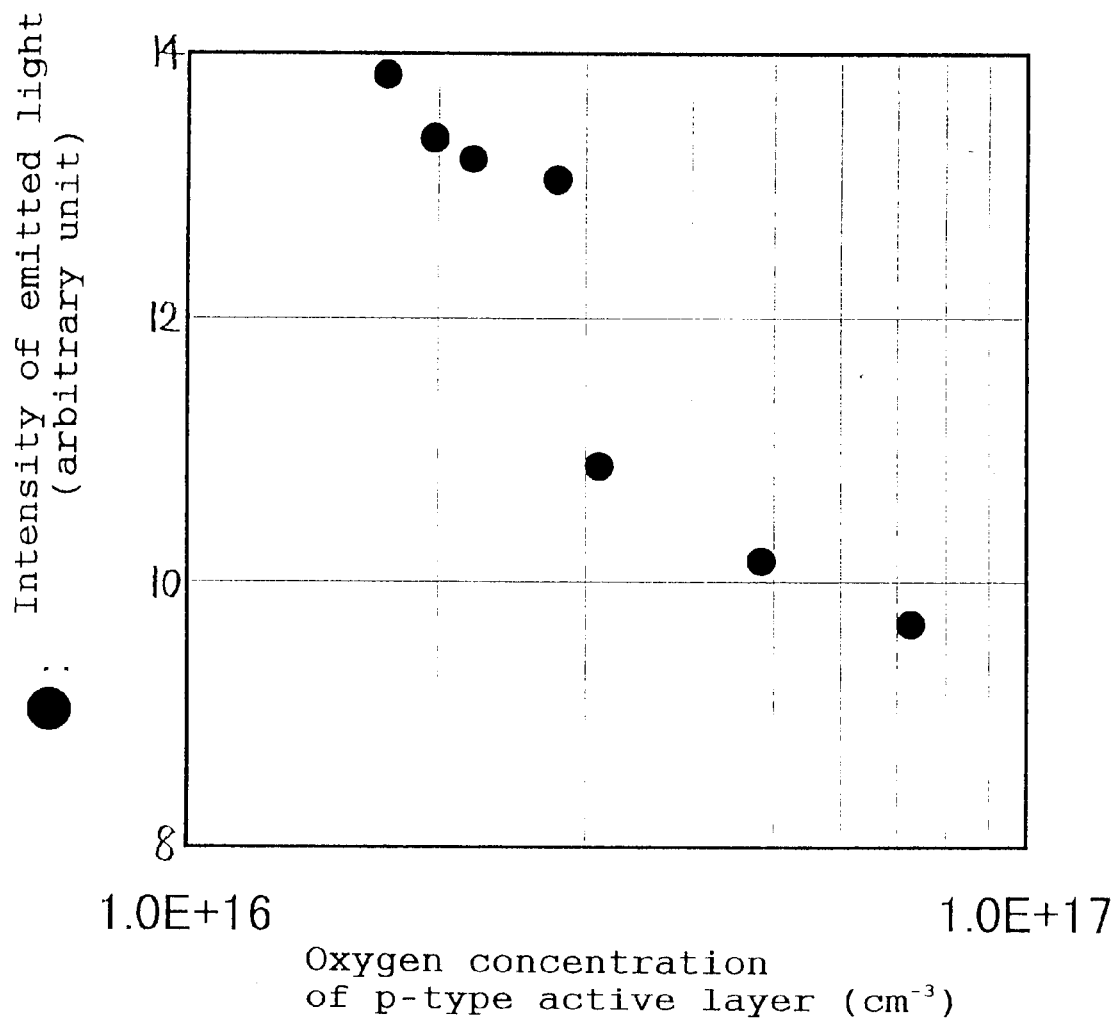
[Fig. 9]

US 6,335,547 B1

EPITAXIAL WAFER FOR INFRARED LIGHT-EMITTING DEVICE AND LIGHT-EMITTING DEVICE USING THE SAME

CROSS REFERENCE TO RELATED APPLICATION

The present application is filed under 35 U.S.C. §111(a), and claims benefit, pursuant to 35 U.S.C. §119(e)(1), of the filing date of Provisional Application No. 60/159,650 filed Oct. 18, 1999 pursuant to 35 U.S.C. §111(b).

FIELD OF THE INVENTION

The present invention relates to an epitaxial wafer for fabricating a high-intensity infrared light-emitting device which is employed in an optical communications and spatial transmission apparatus using infrared radiation. The invention also relates to an infrared light-emitting device fabricated from the epitaxial wafer and to an optical communications and spatial transmission apparatus employing the device.

BACKGROUND ART

Light-emitting devices (hereinafter referred to as LEDs) employing GaAlAs compound semiconductors have been widely used in a light source in a wavelength range from infrared to visible red light. Although an infrared LED is employed in optical communications and spatial transmission, there has been increasing demand for a high-intensity infrared LED of increased capacity for transmitting data and increased transmission distance.

As has conventionally been known, a GaAlAs LED having a double-hetero structure (hereinafter DH structure) exhibits emitted-light intensity higher than that of a GaAlAs LED having a single-hetero structure, and emitted-light intensity is enhanced by means of removing a substrate.

In fabrication of an LED employing a substrate-removed-type structure (hereinafter referred to as a DDH structure), a typical DH structure; i.e., only three layers consisting of a p-type cladding layer, an active layer, and an n-type cladding layer, is epitaxially grown and then a substrate is removed, to thereby reduce the thickness of a produced epitaxial wafer. Such an epitaxial wafer is difficult to handle during processing into a device. In addition, the distance from a bottom surface of the device to the junction decreases, and a paste for bonding the device to a conductor migrates through a side face of the device, to thereby disadvantageously short-circuit the pn junction. In order to avoid this problem, a fourth epitaxial layer is added to the DH structure so as to ensure the overall thickness of the substrate-removed and finished epitaxial wafer and the distance from a bottom surface of the device to the junction. This constitution is standard for a DDH structure. The fourth epitaxial layer is designed to have a band gap wider than that of an active layer, so as not to absorb emitted light from the active layer.

The fourth epitaxial layer is advantageously formed as an n-type layer on the side of an n-type cladding layer, in consideration of suppression of overall electric resistance of a device, since in a GaAlAs system electron mobility is 10 or more times hole mobility. Thus, an n-type layer has an electric resistance lower than that of a p-type layer when carrier concentration and Al compositional proportion in two layers are identical. When an n-type layer is formed on the side of an n-type cladding layer so as to dispose a p-type cladding layer as an LED surface, two arrangements are possible. In one case, as shown in FIG. 2, an n-type GaAs substrate is employed, and on the substrate, a second n-type layer 6, an n-type cladding layer 5, a p-type active layer 4, and a p-type cladding layer 3 are sequentially formed. In the other case, as shown in FIG. 3, a p-type GaAs substrate is employed, and on the substrate, a p-type cladding layer 3, a p-type active layer 4, an n-type cladding layer 5, and a second n-type cladding layer 6 are sequentially formed.

During liquid-phase epitaxy, Te is employed as an n-type dopant. The segregation coefficient of Te increases with decreasing temperature. Therefore, when epitaxial growth is initiated from the n-type substrate 1 as shown in FIG. 2, carrier concentration at the interface between the active layer 4 and the n-type cladding layer 5 increases as compared with carrier concentration obtained through epitaxial growth initiated from the p-type substrate 1 as shown in FIG. 3. Thus, in the constitution shown in FIG. 2, reverse withstand voltage decreases and non-radiative recombination centers are formed due to deterioration in crystallinity at the interface caused by high-concentration Te, thereby lowering intensity of emitted light from a device fabricated by use of the epitaxial wafer.

When Zn, a typical dopant, is employed as a dopant in the p-type cladding layer 3 during epitaxial growth initiated from the p-type substrate 1 as shown in FIG. 3, the active layer 4 must be grown at high temperature, and Zn incorporated in the p-type cladding layer 3 penetrates the active layer 4, thereby diffusing to the n-type cladding layer 5. As a result, a pn junction is shifted to the n-type cladding layer 5, to thereby generate an intermediate layer. The generation of the intermediate layer lowers intensity of emitted light of an LED and elevates forward voltage (VF), to fail to attain required device characteristics.

In order to solve the aforementioned problems, an object of the present invention is to provide an epitaxial wafer for fabricating an infrared LED which has a DDH structure and exhibits high emitted-light intensity, low VF, and excellent device characteristics. Another object is to provide an infrared LED fabricated from the epitaxial wafer.

SUMMARY OF THE INVENTION

The present inventors have carried out earnest studies on reduction of diffusion of dopants from the p-type cladding layer to the n-type cladding layer, and have found that when Ge is employed as a dopant in the p-type cladding layer, dopant diffusion is suppressed and shift of a pn junction is prevented. However, when an electrode is formed on a Ge-doped p-type cladding layer, electric resistance between the electrode and the p-type cladding layer and VF of an LED increase. The inventors have conducted further studies in order to solve the above problem, and found that when a Zn-doped p-type layer is interposed between a p-type cladding layer and the electrode, there is produced an LED which exhibits lowered electric resistance between the electrode and the p-type layer and high emitted-light intensity and has an excellent service life.

The inventors have further carried out studies on optimization of emitted-light intensity and VF in the aforementioned LED, and have found that when the thickness of the n-type cladding layer 5 is controlled to 60–80 $\mu$m, intensity of emitted light of an LED is enhanced, and that when the carrier concentration of each of the n-type cladding layer and the second n-type layer is elevated, VF is lowered but intensity of emitted light is lowered. In addition, in order to attain VF of 2 V or less at 500 mA, which is a standard VF value of an LED of dimensions of 350 $\mu$m×350 $\mu$m, the carrier concentration of each of the n-type cladding layer and the second n-type layer must be controlled to $8 \times 10^{17}$ cm$^{-3}$ or more, whereas when the carrier concentration is in excess of $2 \times 10^{18}$ cm$^{-3}$, intensity of emitted light of an LED decreases considerably.

In the LED according to the present invention, the second n-type layer is formed on the n-type cladding layer such that the two layers are brought into mutual contact, and an n-n junction interface is formed between the two layers. When the n-type epitaxial layers including the n-n interface are inverted to the p-type layers, a thyristor effect generates to thereby disadvantageously shut off electric current. It has been found that the following two mechanisms are considered to cause conduction-type inversion from n to p.

In a first mechanism, Zn evaporated from a melt for forming the first p-type layer is incorporated into a melt for forming the n-type cladding layer or into that for forming the second n-type layer, or Ge-containing crust adhering on substrate-holders during growth of the p-cladding layer and the active layer is incorporated into a melt for forming the n-type cladding layer, to thereby elevate Zn concentration and Ge concentration of the n-type cladding layer or the second n-type layer. In a second mechanism, n-type carrier concentration of an initially grown portion of the second n-type layer decreases, since segregation coefficient of Te decreases with increasing temperature. It has been found that when Zn concentration or Ge concentration is greater than Te concentration, n-p inversion occurs in epitaxial layers involving the aforementioned n-n interface.

In addition, the LED of the present invention has a DDH structure in which a fourth layer is formed on the n-cladding layer side. Thus, the total thickness of the n-type cladding layer and the aforementioned second n-type layer accounts for most of the thickness of the LED. In order to suppress absorption of emitted light by the two layers, the inventors have conducted further studies, and have found that VF increases when the Al compositional proportion in each layer is highest; i.e., when the Al compositional proportion at initiation of growth thereof is in excess of 0.35. As has conventionally been known, in a GaAlAs mixed crystal system, when the Al compositional proportion increases, electron mobility decreases abruptly. According to *J. Inst. Electron. Telecommun., Eng.*, vol. 29, p. 97, 1985 (A. K. Saxena), electron mobility is the lowest at an Al compositional proportion of 0.45. In the LED of the structure according to the present invention, the highest Al compositional proportion of each of the aforementioned n-type cladding layer and the second n-type layer is found to be 0.35, which is lower than the Al compositional proportion reported in the literature.

Furthermore, dopants in the p-type cladding layer and the p-type active layer have been investigated, and the inventors have found that when Ge is employed as a dopant in the p-type cladding layer and the p-type active layer, intensity of emitted light and response speed of an LED are affected by variation of carrier concentration, to thereby provide disadvantageously poor LED characteristics. The inventors have investigated further, and have found that variation in thickness of the active layer and variation in oxygen concentration of the active layer also inhibit stabilization of LED characteristics. The present invention has been accomplished on the basis of these findings.

Accordingly, the present invention is directed to the following:

[1] an epitaxial wafer for fabricating an infrared light-emitting device, which wafer is obtained by sequentially stacking, on a p-type GaAs single-crystal substrate, a first p-type layer ($Ga_{1-X1}Al_{X1}As$, $0.18 \leq X1 \leq 0.25$); a p-type cladding layer ($Ga_{1-X2}Al_{X2}As$, $0.15 \leq X2 \leq 0.23$); a p-type active layer ($Ga_{1-X3}Al_{X3}As$, $0 \leq X3 \leq 0.03$) which has an emission wavelength of 850–900 nm; an n-type cladding layer ($Ga_{1-X4}Al_{X4}As$, $X3 < X4 \leq 0.45$); and a second n-type layer ($Ga_{1-X5}Al_{X5}As$, $X3 \leq X5 \leq 0.45$), through liquid phase epitaxy, and, subsequently, removing the p-type GaAs single-crystal substrate, wherein zinc is employed as a dopant in the first p-type layer; germanium is employed as a dopant in the p-type cladding layer and the active layer; and the carrier concentration of each of the p-type cladding layer and the active layer is not less than $8 \times 10^{17}$ cm$^{-3}$ and less than $1.2 \times 10^{18}$ cm$^{-3}$;

[2] an epitaxial wafer for fabricating an infrared light-emitting device as described in [1], wherein each of the n-type cladding layer and the second n-type layer has an average carrier concentration of $8 \times 10^{17}$ cm$^{-3}$ to $2 \times 10^{18}$ cm$^{-3}$ and the n-type cladding layer has a thickness of 60–80 μm;

[3] an epitaxial wafer for fabricating an infrared light-emitting device as described in [1] and/or [2], wherein the second n-type layer has a total concentration of Zn and Ge of $1 \times 10^{17}$ atoms/cm$^3$ or less; Te is employed as a dopant in the n-type cladding layer and the second n-type layer; and the dopant concentration of the portion in the second n-type layer within 3 μm of the interface between the n-type cladding layer and the second n-type layer is $3 \times 10^{17}$ cm$^{-3}$ or more;

[4] an epitaxial wafer for fabricating an infrared light-emitting device as described in any one of [1] to [3], wherein compositional proportions of Al in the n-type cladding layer and the second n-type layer are such that $0.10 < X4 < 0.35$ and $0.10 < X5 < 0.35$.

[5] an epitaxial wafer for fabricating an infrared light-emitting device as described in any one of [1] to [4], wherein the p-type active layer has a thickness of 0.5–1.2 μm and an oxygen concentration of less than $3 \times 10^{16}$ atoms/cm$^3$;

[6] a light-emitting device fabricated by use of an epitaxial wafer for fabricating an infrared light-emitting device as recited in any one of [1] to [5]; and

[7] an optical communications and spatial transmission apparatus employing a light-emitting device as recited in [6].

BRIEF DESCRIPTION OF THE DRAWINGS

FIG. 1 shows the structure of the epitaxial wafer (before the p-type GaAs single-crystal substrate is removed) according to the present invention.

FIG. 2 is shows a DDH structure in which an n-type GaAs substrate is removed and an n-type cladding layer is grown on an epitaxial layer.

FIG. 3 is shows a DDH structure in which a p-type GaAs substrate is removed and an epitaxial layer is grown on an n-type cladding layer.

FIG. 4 shows an epitaxial growth jig employed in carrying out the present invention.

FIG. 5 shows the relationship between carrier concentration of an n-type cladding layer and carrier concentration of a second n-type layer, as well as intensity of emitted light of an LED and VF at each data point.

FIG. 6 shows the relationship between thickness of the n-type cladding layer and intensity of emitted light of an LED.

FIG. 7 shows the relationship between total concentration of Ge and Zn and minimum Te concentration of a portion in the second n-type layer within 3 μm of the interface between the n-type cladding layer and the second n-type layer, as well as occurrence of a thyristor effect at each data point.

FIG. 8 shows the relationship between thickness of the active layer, and intensity of emitted light and response speed (rise time) of fabricated LEDs.

FIG. 9 shows the relationship between oxygen concentration of the active layer, and intensity of emitted light and response speed (rise time) of fabricated LEDs.

DETAILED DESCRIPTION OF THE INVENTION

Modes for carrying out the present invention will next be described. FIG. 1 is a schematic view of a multilayer structure of the epitaxial wafer (before a p-type GaAs single-crystal substrate is removed) described in the specification, which wafer has a structure in which on a p-type GaAs single-crystal substrate 1 there are sequentially formed a first p-type layer ($Ga_{1-X1}Al_{X1}As$, $0.18 \leq X1 \leq 0.25$) 2; a p-type cladding layer ($Ga_{1-X2}Al_{X2}As$, $0.15 \leq X2 \leq 0.23$) 3; a p-type active layer ($Ga_{1-X3}Al_{X3}As$, $0 \leq X3 \leq 0.03$) 4 which has an emission wavelength of 850–900 nm; an n-type cladding layer ($Ga_{1-X4}Al_{X4}As$, $X3 < X4 \leq 0.45$) 5; and a second n-type layer ($Ga_{1-X5}Al_{X5}As$, $X3 < X5 \leq 0.45$) 6. Reference numeral 7 in FIG. 1 represents a front surface of a device which is produced by use of the epitaxial wafer. The mixed crystal ratio of the active layer is selected so as to yield an emission wavelength of 850–900 nm, while the mixed crystal ratio of each of the first p-type layer, the p-type cladding layer, the n-type cladding layer, and the second n-type layer is selected such that the band gap of each layer is wider than that of the active layer so as not to absorb emitted light from the active layer. The first p-type layer contains Zn as a dopant, the p-type cladding layer and the p-type active layer contain Ge as a dopant, and the n-type layer contains Te as a dopant. Dopant concentration of the active layer is selected so as to attain an optimum balance between intensity of emitted light and a response speed of an LED.

The aforementioned epitaxial wafer may be produced through liquid-phase epitaxy or vapor-phase epitaxy. In the specification the growth method will be described while liquid-phase epitaxy is taken as an example.

During growth of the epitaxial wafer having the aforementioned structure according to the present invention, an apparatus as shown in FIG. 4 may be used. A p-type GaAs substrate 8 is fixed in a substrate-holder 9, and a plurality of substrate-holders 9 are fixed by a hanger 10. The hanger 10 can move upward and downward by means of an appropriate driving mechanism (not shown). Crucibles 11 to 16 are fixed on a crucible support 17, and the crucible support can move right and left by means of an appropriate driving mechanism (not shown). In crucibles 11, 13, 14, 15, and 16, respectively, are placed a composition containing metallic Ga, polycrystalline GaAs, Al, and a dopant suitable for growing the first p-type layer; a similar composition for growing the p-type cladding layer; a similar composition for growing the p-type active layer; a similar composition for growing the n-type cladding layer; and a similar composition for growing the second n-type layer (see FIG. 1 for respective layers). Each crucible is covered with a crucible cap 18 made of glassy carbon.

In the present invention, incorporation of Zn contained in the first p-type layer into a crucible for forming the p-type layer must be suppressed. In order to prevent the above incorporation, the crucible 11 including Zn as a dopant a melt is set under a gas flow in a reaction tube, and the crucible can be isolated from other crucibles by disposing a vacant crucible 12 between crucibles including respective melts. By employment of a glassy carbon-made crucible cap having a lower porosity instead of a customarily employed graphite-made crucible cap, evaporation of Zn from the crucible 11 is prevented and incorporation of Zn into other crucibles can be suppressed.

In the present invention, the oxygen concentration of the active layer is preferably controlled to less than $3 \times 10^{16}$ $cm^{-3}$. To attain this level, a film-formation apparatus as shown in FIG. 4 is baked in advance to thereby remove matter adsorbed on a reactor, such as oxygen. In addition, raw materials for forming film are preferably baked.

In practice, growth is carried out in the following manner. Firstly, a jig shown in FIG. 4 is set in a reaction tube made of quartz (not shown) and heated under hydrogen flow, to thereby melt raw materials. During melting, the holders 10 are retained in a vacant crucible 12, to thereby prevent loss of As at high temperature. Subsequently, the temperature of the atmosphere is lowered, and the holders 10 are lifted up. The crucible support 17 is moved rightward in FIG. 4, to thereby set the crucible 11 under the holders 10. Then, the holders 10 are lowered to the crucible 11, to thereby dip the wafers therein. Subsequently, the temperature of the atmosphere is gradually lowered, to thereby grow on each wafer a first p-type layer as shown in FIG. 1. After the layer is grown, the holders 10 are lifted up so as to isolate the wafers from the melt, and the crucible support 17 is moved leftward in FIG. 4, to thereby set the vacant crucible 12 under the holders 10. At this moment, Zn-containing residual melt provided from the crucible 11 is shaken off by means of moving the holders 10 up and down several times, to thereby prevent migration of the residue into the subsequent crucibles. The holders 10 are lifted up again, and the crucible support 4 is moved to thereby set the crucible 13 under the holders 10. The holders 10 are lowered, to thereby bring the holders 10 into contact with the melt contained in the crucible 13. Thereafter, lowering of temperature and movement of the holders and crucible support are repeated, to thereby grow a structure as shown in FIG. 1.

In a manner described above, the holders 10 are moved up and down on a crucible 14 after a p-type active layer is grown, to thereby prevent migration, into a crucible for forming an n-type layer, of residues such as Zn and Ge employed for forming the p-type layer. Thus, Zn concentration and Ge concentration of the n-type layer can be lowered.

After completion of epitaxial growth, the epitaxial wafer is removed. The surface of the second n-type layer shown in FIG. 1 is coated with an acid-resistant sheet, and the p-type GaAs substrate is selectively removed by use of an ammonia-hydrogen peroxide etchant. Subsequently, an electrode is formed in each surface of the epitaxial substrate, and elements are isolated through dicing, to thereby fabricate an infrared LED having the first p-type layer serving as a front face.

BEST MODE FOR CARRYING OUT THE INVENTION

The present invention will next be described in more detail by way of examples and comparative example, which should not be construed as limiting the invention thereto.

WORKING EXAMPLE OF THE INVENTION

Epitaxial growth was carried out by use of a jig shown in FIG. 4. As mentioned above, a crucible 11 was set under the downstream end of the gas flow in a reaction tube so as to prevent migration of Zn contained in a first p-type layer into a crucible including a melt for forming a p-type layer. The crucible 11 was isolated from other ones by means of disposing a vacant crucible 12. A crucible cap made of glassy carbon of low porosity was employed. Prior to film formation, the reactor and raw materials were sufficiently baked at 1000° C.

In practice, the jig shown in FIG. 4 was set in a reaction tube made of quartz (not shown) and heated to 940° C. under hydrogen flow, to thereby melt raw materials. During melting, the holders 10 were retained in the vacant crucible 12. Subsequently, the temperature of the atmosphere was lowered to 925° C., and the holders 10 were lifted up. The crucible support 17 was moved rightward in FIG. 4, to thereby set the crucible 11 under the holders 10. Then, the holders 10 were lowered to the crucible 11, to thereby dip the wafers in the crucible. Subsequently, the temperature of the atmosphere was lowered to 905° C. at a cooling rate of 0.5° C./minute, to thereby grow on each wafer a first p-type layer as shown in FIG. 1. After the layer was grown, the holders 10 were lifted up so as to isolate the wafers from the melt while the temperature of the atmosphere was maintained at 905° C. Subsequently, the crucible support 17 was moved leftward in FIG. 4, to thereby set the vacant crucible 12 under the holders 10. At that moment, Zn-containing residual melt provided from the crucible 11 was shaken off by means of moving the holders 10 up and down several times. The holders 10 were lifted up again, and the crucible support 11 was moved to thereby set the crucible 13 under the holders 10. The holders 10 were lowered, to thereby bring the holders into contact with the melt contained in the crucible 13. Thereafter, lowering of temperature and movement of the holders and crucible support were repeated, to thereby grow a structure as shown in FIG. 1. After growing of a p-type active layer in crucible 14, the holders 10 were gently oscillated up and down so as to remove residue of p-type melt.

After completion of epitaxial growth, the mixed crystal ratio, thickness, and carrier concentration of each layer were measured. The obtained mixed crystal ratio of the first p-type layer $Ga_{1-X1}Al_{X1}As$ was such that $0.20 \leq X1 \leq 0.22$; that of the p-type cladding layer $Ga_{1-X2}Al_{X2}As$ was such that $0.18 \leq X2 \leq 0.20$; that of the p-type active layer $Ga_{1-X3}Al_{X3}As$ was such that $X3=0.01$; that of the n-type cladding layer $Ga_{1-X4}Al_{X4}As$ was such that $0.10<X4 \leq 0.30$; and that of the second n-type layer $Ga_{1-X5}Al_{X5}As$ was such that $0.10<X5 \leq 0.30$. The four layers other than the p-type active layer have mixed crystal ratios distributed within ranges, since these layers are grown through a slow-cooling method and the Al ratio in each epitaxial layer decreases toward the front face of a device. The average carrier concentration of the first p-type layer was $2 \times 10^{18}$ cm$^{-3}$; that of the p-type cladding layer was $1 \times 10^{18}$ cm$^{-3}$, that of the n-type cladding layer was $1 \times 10^{18}$ cm$^{-3}$; and that of the second n-type layer was $1.5 \times 10^{18}$ cm$^{-3}$. The thickness of the first p-type layer was 30 µm; that of the p-type cladding layer was 15 µm; that of the p-type active layer was 0.6 µm, that of the n-type cladding layer was 75 µm; and that of the second n-type layer was 75 µm.

After completion of epitaxial growth, the epitaxial wafer was removed. The surface of the second n-type cladding layer shown in FIG. 1 was coated with an acid-resistant sheet, and the p-type GaAs substrate was selectively removed through etching by use of an ammonia-hydrogen peroxide etchant. Subsequently, an electrode was formed in each surface of the epitaxial substrate, and elements were isolated through dicing, to thereby fabricate LEDs having dimensions of 350 µm×350 µm in which the first p-type layer serves as a front face.

COMPARATIVE EXAMPLE 1

The procedure of the Working Example of the Invention was repeated, except that Zn was employed as the dopant in the p-type cladding layer, to thereby perform epitaxial growth and fabricate LEDs.

COMPARATIVE EXAMPLE 2

The procedure of the Working Example of the Invention was repeated, except that Ge was employed as the dopant in the first p-type layer, to thereby perform epitaxial growth and fabricate LEDs.

COMPARATIVE EXAMPLE 3

The procedure of the Working Example of the Invention was repeated, except that the carrier concentration of the n-type cladding layer and that of the second n-type layer were modified, to thereby perform epitaxial growth and fabricate LEDs.

COMPARATIVE EXAMPLE 4

Conditions of epitaxial growth carried out in the Working Example of the Invention were employed, except that the thickness of the n-type cladding layer was modified, to thereby fabricate LEDs. The thickness was modified by means of elevating or lowering the temperature for terminating growth of the n-type cladding layer, while the temperature for initiating growth thereof was identical with that employed in the Working Example of the Invention. Although the temperature for initiating growth of the second n-type layer (the temperature for terminating growth of the n-type cladding layer) was varied, the second n-type layer was grown so as to have the same feature, by means of adjusting the composition of a melt for forming the second n-type layer and the temperature for terminating growth thereof.

COMPARATIVE EXAMPLE 5

Conditions of epitaxial growth carried out in the Working Example of the Invention were employed, except that crucible caps having a medium porosity were employed and the carrier concentration of the n-type cladding layer and that of the second n-type layer were modified. Thereby, epitaxial growth was carried out and an LED was fabricated.

COMPARATIVE EXAMPLE 6

The procedure of the Working Example of the Invention was repeated, except that the thickness of the p-type active layer was modified, to thereby perform film formation and fabricate LEDs.

COMPARATIVE EXAMPLE 7

The procedure of the Working Example of the Invention was repeated, except that the baking temperature of the film formation apparatus and raw materials was altered from 1000° C. to 600° C., to thereby perform epitaxial growth and fabricate LEDs.

Table 1 shows characteristics of LEDs fabricated in the Working Example of the Invention and Comparative Examples 1 and 2; i.e., VF (at 500 mA), intensity of emitted light of LEDs, and generation of an intermediate layer formed by diffusing Zn serving as a p-type dopant into an n-type cladding layer.

TABLE 1

| Characteristics | Working Example | Comp. Ex. 1 | Comp. Ex. 2 |
|---|---|---|---|
| Dopant in first p-type layer | Zn | Zn | Ge |
| Dopant in p-type cladding layer | Ge | Zn | Ge |
| VF (500 mA) | 1.9 V | 2.3 V | 3.5 V |
| Intensity of emitted light of LED (arbitrary unit) | 17 | 10 | 12 |
| Generation of intermediate layer | none | generated | none |

Generation of an intermediate layer was confirmed by observing a cross-section of the produced epitaxial wafers under an SEM.

In the LED fabricated in Comparative Example 1, the intensity of emitted light is considerably low and the VF is high as compared with the case of the LED fabricated in the Working Example of the Invention. In the LED fabricated in Comparative Example 2, the intensity reaches 12, which is a target level, but the VF is higher than that of the LED fabricated in the Working Example of the Invention; i.e., the standard value of 2 V or lower at 500 mA is not attained. Thus, it has been proven that Zn is an appropriate dopant in the first p-type layer and that Ge is an appropriate dopants in the p-type cladding layer.

For LEDs fabricated in the Working Example of the Invention and Comparative Example 3, FIG. 5 shows the relationships between carrier concentration of the n-type cladding layer and carrier concentration of the second n-type layer, as well as intensity of emitted light of LEDs and VF (at 500 mA) at each data point. In FIG. 5, each data point represents an average of the values of 100 chips. As is clear from FIG. 5, the average carrier concentration of the n-type cladding layer and that of the aforementioned second n-type layer are controlled to $8 \times 10^{17}$ cm$^{-3}$ to $2 \times 10^{18}$ cm$^{-3}$ so as to attain an intensity of emitted light of 12 or higher (arbitrary unit); i.e., target level, and a VF lower than 2 V.

For LEDs fabricated in the Working Example of the Invention and Comparative Example 4, FIG. 6 shows the relationships between thickness of the n-type cladding layer and intensity of emitted light of LEDs. In FIG. 6, each data point represents an average value for 100 chips. As is clear from FIG. 6, the thickness of the n-type cladding layer should be controlled to 60–80 μm so as to attain an intensity of emitted light of 12 or higher; i.e., the target level.

For LEDs fabricated in the Working Example of the Invention and Comparative Example 5, FIG. 7 shows the relationship between total concentration of Ge and Zn and minimum Te concentration of a portion in the second n-type layer within 3 μm of the growth of interface between the n-type cladding layer and the second n-type layer, as well as occurrence of a thyristor effect at each data point. The concentration of Ge, Zn, or Te in the layer was obtained through SIMS. As shown in FIG. 7, LEDs fabricated in the Working Example of the Invention have a total concentration of Ge and Zn in the n-type cladding layer of $1 \times 10^{17}$ atoms/cm$^3$ or less and a Te concentration of a portion in the second n-type layer within 3 μm of the interface between the n-type cladding layer and the second n-type layer of $3 \times 10^{17}$ atoms/cm$^3$ or more, and no thyristor effect is observed. In contrast, a thyristor effect is readily generated in LEDs fabricated in Comparative Example 5, wherein the total concentration of Ge and Zn in the n-type cladding layer is more than $1 \times 10^{17}$ atoms/cm$^3$ and the Te concentration of a portion in the second n-type layer within 3 μm of the interface between the n-type cladding layer and the second n-type layer is less than $3 \times 10^{17}$ atoms/cm$^3$. Thus, in order to prevent conduction-type inversion of the interface between the n-type cladding layer and the second n-type layer and suppress a thyristor effect, the total concentration of Ge and Zn in the second n-type layer is controlled to $1 \times 10^{17}$ atoms/cm$^3$ or less and the dopant concentration of a portion in the second n-type layer within 3 μm of the interface between the n-type cladding layer and the second n-type layer is controlled $3 \times 10^{17}$ atoms/cm$^3$ or more.

Regarding LEDs fabricated in the Working Example of the Invention and Comparative Examples 6 and 7, FIG. 8 shows the relationship between thickness of the active layer, and intensity of emitted light or response speed (rise time) of fabricated LEDs, and FIG. 9 shows the relationship between oxygen concentration of the active layer and intensity of emitted light of fabricated LEDs. The oxygen concentration of the active layer was estimated through SIMS. As is clear from FIG. 8, when the thickness of the active layer falls outside the range of 0.5–1.2 μm, the intensity of emitted light is less than the target value, whereas when the thickness is in excess of 1.2 μm, the response speed is lowered. As is clear from FIG. 9, when the oxygen concentration of the active layer is in excess of $3 \times 10^{16}$ atoms/cm$^3$, the intensity of emitted light decreases. Thus, in order to attain satisfactory intensity of emitted light and response speed, the p-type active layer has a thickness of 0.5 μm to 1.2 μm and an oxygen concentration of less than $3 \times 10^{16}$ atoms/cm$^3$.

INDUSTRIAL APPLICABILITY

By use of the epitaxial wafer according to the present invention for fabricating an infrared light-emitting device, high-intensity and low-VF infrared LEDs are produced.

Particularly, when the average carrier concentration of the n-type cladding layer and the second n-type layer; the thickness of the n-type cladding layer; the Al compositional proportion of the n-type cladding layer and the second n-type layer; the thickness of the p-type active layer; and the oxygen concentration of the p-type active layer are controlled within the ranges specified by the present invention, particularly high-intensity and low-VF infrared LEDs are produced.

In addition, when the Zn concentration or Ge concentration of the second n-type layer is lowered, Te is employed as a dopant in the n-type cladding layer and the second n-type layer, and the dopant concentration of the portion in the second n-type layer within 3 μm of the interface between the n-type cladding layer and the second n-type layer is controlled within the range according to the invention, there can be provided LEDs in which occurrence of a thyristor effect is prevented.

Furthermore, by use of the epitaxial wafer according to the present invention for fabricating an infrared light-emitting device, the intensity of emitted light and the service life of LEDs are enhanced, and there can be provided reliable optical communications and spatial transmission apparatuses adapted to increased capacity for transmitting data and increased transmission distance.

What is claimed is:

1. An epitaxial wafer for fabricating an infrared light-emitting device, which wafer is obtained by sequentially stacking, on a p-type GaAs single-crystal substrate, a first p-type layer ($Ga_{1-X1}Al_{X1}As$, $0.18 \leq X1 \leq 0.25$); a p-type cladding layer ($Ga_{1-X2}Al_{X2}As$, $0.15 \leq X2 \leq 0.23$); a p-type active layer ($Ga_{1-X3}Al_{X3}As$, $0 \leq X3 \leq 0.03$) which has an emission wavelength of 850–900 nm; an n-type cladding layer ($Ga_{1-X4}Al_{X4}As$, $X3 < X4 \leq 0.45$); and a second n-type layer ($Ga_{1-X5}Al_{X5}As$, $X3 \leq X5 \leq 0.45$), through liquid phase epitaxy, and, subsequently, removing the p-type GaAs single-crystal substrate, wherein zinc is employed as a dopant in the first p-type layer; germanium is employed as a dopant in the p-type cladding layer and the active layer; and the carrier concentration of each of the p-type cladding layer and the active layer is not less than $8 \times 10^{17}$ cm$^{-3}$ and less than $1.2 \times 10^{18}$ cm$^{-3}$.

2. An epitaxial wafer for fabricating an infrared light-emitting device as described in claim 1, wherein each of the n-type cladding layer and the second n-type layer has an average carrier concentration of $8 \times 10^{17}$ cm$^{-3}$ to $2 \times 10^{18}$ cm$^{-3}$ and the n-type cladding layer has a thickness of 60–80 μm.

3. An epitaxial wafer for fabricating an infrared light-emitting device as described in claim 1 or 2, wherein the second n-type layer has a total concentration of Zn and Ge of $1 \times 10^{17}$ atoms/cm$^3$ or less; Te is employed as a dopant in the n-type cladding layer and the second n-type layer; and the dopant concentration of the portion in the second n-type layer within 3 μm of the interface between the n-type cladding layer and the second n-type layer is $3 \times 10^{17}$ cm$^{-3}$ or more.

4. An epitaxial wafer for fabricating an infrared light-emitting device as described in claim 1 or 2, wherein compositional proportions of Al in the n-type cladding layer and the second n-type layer are such that $0.10 < X4 < 0.35$ and $0.10 < X5 < 0.35$.

5. An epitaxial wafer for fabricating an infrared light-emitting device as described in claim 1 or 2, wherein the p-type active layer has a thickness of 0.5–1.2 μm and an oxygen concentration of less than $3 \times 10^{16}$ atoms/cm$^3$.

6. A light-emitting device fabricated by use of an epitaxial wafer for fabricating an infrared light-emitting device as recited in claim 1 or 2.

7. An optical communications and spatial transmission apparatus employing a light-emitting device as recited in claim 6.

* * * * *